United States Patent
Lee

(10) Patent No.: US 11,380,874 B2
(45) Date of Patent: Jul. 5, 2022

(54) ORGANIC LIGHT EMITTING DIODE AND DISPLAY DEVICE HAVING THE SAME

(71) Applicant: Samsung Display Co., Ltd., Yongin-si (KR)

(72) Inventor: Hyunshik Lee, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 96 days.

(21) Appl. No.: 16/907,069

(22) Filed: Jun. 19, 2020

(65) Prior Publication Data

US 2021/0066668 A1    Mar. 4, 2021

(30) Foreign Application Priority Data

Sep. 4, 2019    (KR) .................... 10-2019-0109650

(51) Int. Cl.
*H01L 51/52*    (2006.01)
*H01L 51/50*    (2006.01)
*H01L 27/32*    (2006.01)

(52) U.S. Cl.
CPC ........ *H01L 51/5278* (2013.01); *H01L 27/322* (2013.01); *H01L 51/5044* (2013.01); *H01L 51/5056* (2013.01); *H01L 51/5088* (2013.01); *H01L 51/5096* (2013.01); *H01L 51/5265* (2013.01); *H01L 2251/5376* (2013.01); *H01L 2251/558* (2013.01)

(58) Field of Classification Search
CPC ............... H01L 51/5278; H01L 27/322; H01L 51/5044; H01L 51/5265
See application file for complete search history.

(56) References Cited

U.S. PATENT DOCUMENTS

| | | | |
|---|---|---|---|
| 9,614,170 | B2 | 4/2017 | Ogiwara et al. |
| 2016/0248031 | A1* | 8/2016 | Seo .......... C09K 11/06 |
| 2017/0092870 | A1* | 3/2017 | Kim .................. H01L 51/0067 |
| 2018/0006260 | A1* | 1/2018 | Yoon .................. H01L 51/5203 |
| 2018/0097202 | A1 | 4/2018 | Forrest et al. |
| 2018/0374409 | A1 | 12/2018 | Lee et al. |
| 2019/0319209 | A1 | 10/2019 | Tanaka |
| 2020/0295090 | A1* | 9/2020 | Cho ................... H01L 51/5284 |

FOREIGN PATENT DOCUMENTS

| | | |
|---|---|---|
| JP | 6155378 B1 | 6/2017 |
| KR | 10-2014-0032315 A | 3/2014 |
| KR | 10-2015-0060976 A | 6/2015 |
| KR | 10-2018-0078848 A | 7/2018 |
| KR | 10-2019-0000759 A | 1/2019 |

* cited by examiner

*Primary Examiner* — Anthony Ho
(74) *Attorney, Agent, or Firm* — Lewis Roca Rothgerber Christie LLP

(57) ABSTRACT

An organic light emitting diode includes: a first electrode layer; a second electrode layer on the first electrode layer and facing the first electrode layer; a first light emitting layer between the first electrode layer and the second electrode layer and comprising a phosphorescent material; a first hole control layer between the first electrode layer and the first light emitting layer; a second light emitting layer between the first light emitting layer and the second electrode layer and comprising a fluorescent material; and a charge generating layer between the first light emitting layer and the second light emitting layer, the first hole control layer having a thickness equal to or greater than 100 angstroms and equal to or smaller than 900 angstroms.

19 Claims, 7 Drawing Sheets

ORGANIC LIGHT EMITTING DIODE AND DISPLAY DEVICE HAVING THE SAME

CROSS-REFERENCE TO RELATED APPLICATION

This application claims priority to and the benefit of Korean Patent Application No. 10-2019-0109650, filed on Sep. 4, 2019, the contents of which are hereby incorporated by reference in its entirety.

BACKGROUND

1. Field

Aspects of some example embodiments of the present disclosure relate to an organic light emitting diode and a display device having the same.

2. Description of the Related Art

Organic light emitting diodes have a relatively fast response speed, and may be driven at a relatively low voltage, and are self-emissive. Accordingly, organic light emitting display devices employing organic light emitting diodes generally may not utilize a separate light source and may have certain characteristics such as being relatively lightweight, having a relatively thin thickness, having a relatively high brightness, and a relatively improved viewing angle.

Organic light emitting diodes are display elements that include an anode electrode, a cathode electrode, and a light emitting layer formed of an organic material and located between the anode electrode and the cathode electrode. Holes provided from the anode electrode are recombined with electrons provided from the cathode electrode in the light emitting layer to generate excitons, and the excitons emit light corresponding to energy between the holes and the electrons.

The above information disclosed in this Background section is only for enhancement of understanding of the background and therefore the information discussed in this Background section does not necessarily constitute prior art.

SUMMARY

Aspects of some example embodiments of the present disclosure relate to an organic light emitting diode and a display device having the same. For example, aspects of some example embodiments of the present disclosure relate to an organic light emitting diode including a plurality of light emitting layers and a display device including the organic light emitting diode.

Aspects of some example embodiments of the present disclosure include an organic light emitting diode having relatively improved light emission efficiency and having a relatively improved lifespan.

Aspects of some example embodiments of the present disclosure include a display device having the organic light emitting diode.

According to some example embodiments of the inventive concept, an organic light emitting diode includes: a first electrode layer, a second electrode layer on the first electrode layer to face the first electrode layer, a first light emitting layer between the first electrode layer and the second electrode layer and including a phosphorescent material, a first hole control layer between the first electrode layer and the first light emitting layer, a second light emitting layer between the first light emitting layer and the second electrode layer and including a fluorescent material, and a charge generating layer between the first light emitting layer and the second light emitting layer. The first hole control layer has a thickness equal to or greater than about 100 angstroms and equal to or smaller than about 900 angstroms.

According to some example embodiments, the first light emitting layer and the second light emitting layer generate lights having the same color.

According to some example embodiments, the lights are blue lights.

According to some example embodiments, the first electrode layer is a reflective electrode layer, and the second electrode layer is a semi-transmissive electrode layer.

According to some example embodiments, the organic light emitting diode further includes a third light emitting layer between the first light emitting layer and the second light emitting layer. The charge generating layer is provided in a plural number and includes a first charge generating layer and a second charge generating layer, the first charge generating layer is between the first light emitting layer and the third light emitting layer, and the second charge generating layer is between the second light emitting layer and the third light emitting layer.

According to some example embodiments, the organic light emitting diode further includes a fourth light emitting layer between the first light emitting layer and the third light emitting layer. The charge generating layer further includes a third charge generating layer, and the third charge generating layer is between the fourth light emitting layer and the third light emitting layer.

According to some example embodiments, the organic light emitting diode further includes at least one of a second hole control layer between the second charge generating layer and the second light emitting layer, a third hole control layer between the third charge generating layer and the third light emitting layer, or a fourth hole control layer between the first charge generating layer and the fourth light emitting layer.

According to some example embodiments, each of the first, second, third, and fourth hole control layers includes at least one of a hole injection layer, a hole transport layer, a hole buffer layer, or an electron blocking layer.

According to some example embodiments, the organic light emitting diode further includes electron control layers respectively on the first, second, third, and fourth light emitting layers, and each of the electron control layers includes at least one of an electron injection layer, an electron transport layer, or a hole blocking layer.

According to some example embodiments, a resonance distance of the organic light emitting diode is a distance between a surface of the first electrode layer and a surface of the second electrode layer, which faces the surface of the first electrode layer.

According to some example embodiments of the inventive concept, a display device includes a display panel and a color control layer on the display panel. The display panel includes a first electrode layer, a second electrode layer on the first electrode layer to face the first electrode layer, a first light emitting layer between the first electrode layer and the second electrode layer, generating a first light having a predetermined wavelength, and including a phosphorescent material, a first hole control layer between the first electrode layer and the first light emitting layer, a second light emitting layer between the first light emitting layer and the second electrode layer, generating a second light having a predetermined wavelength, and including a fluorescent material, and a charge generating layer between the first light emitting layer and the second light emitting layer. The first light has a same color as the second light.

According to some example embodiments, the first light and the second light are blue lights.

According to some example embodiments, the hole control layer has a thickness equal to or greater than about 100 angstroms and equal to or smaller than about 900 angstroms.

According to some example embodiments, the first electrode layer is a reflective electrode layer, and the second electrode layer is a semi-transmissive electrode layer.

According to some example embodiments, the display panel further includes a third light emitting layer between the first light emitting layer and the second light emitting layer, the charge generating layer is provided in a plural number and includes a first charge generating layer and a second charge generating layer, the first charge generating layer is between the first light emitting layer and the third light emitting layer, and the second charge generating layer is between the second light emitting layer and the third light emitting layer.

According to some example embodiments, the display panel further includes a fourth light emitting layer between the first light emitting layer and the third light emitting layer, the charge generating layer further includes a third charge generating layer, and the third charge generating layer is between the fourth light emitting layer and the third light emitting layer.

According to some example embodiments, the organic light emitting diode further includes at least one of a second hole control layer between the second charge generating layer and the second light emitting layer, a third hole control layer between the third charge generating layer and the third light emitting layer, or a fourth hole control layer between the first charge generating layer and the fourth light emitting layer.

According to some example embodiments, each of the first, second, third, and fourth hole control layers includes at least one of a hole injection layer, a hole transport layer, a hole buffer layer, or an electron blocking layer.

According to some example embodiments, the organic light emitting diode further includes electron control layers respectively on the first, second, third, and fourth light emitting layers, and each of the electron control layers includes at least one of an electron injection layer, an electron transport layer, or a hole blocking layer.

According to some example embodiments, the color control layer includes a quantum dot.

According to the above, the organic light emitting diode may have relatively improved light emission efficiency and relatively improved color purity by limiting an interlayer distance.

In addition, because the light emitting layer, which is located closest to an anode electrode among the light emitting layers of the organic light emitting diode, includes the phosphorescent material, the lifespan of the organic light emitting diodes may increase.

BRIEF DESCRIPTION OF THE DRAWINGS

The above and other characteristics of embodiments according to the present disclosure will become more apparent by reference to the following detailed description when considered in conjunction with the accompanying drawings wherein.

DETAILED DESCRIPTION

Figure 1:
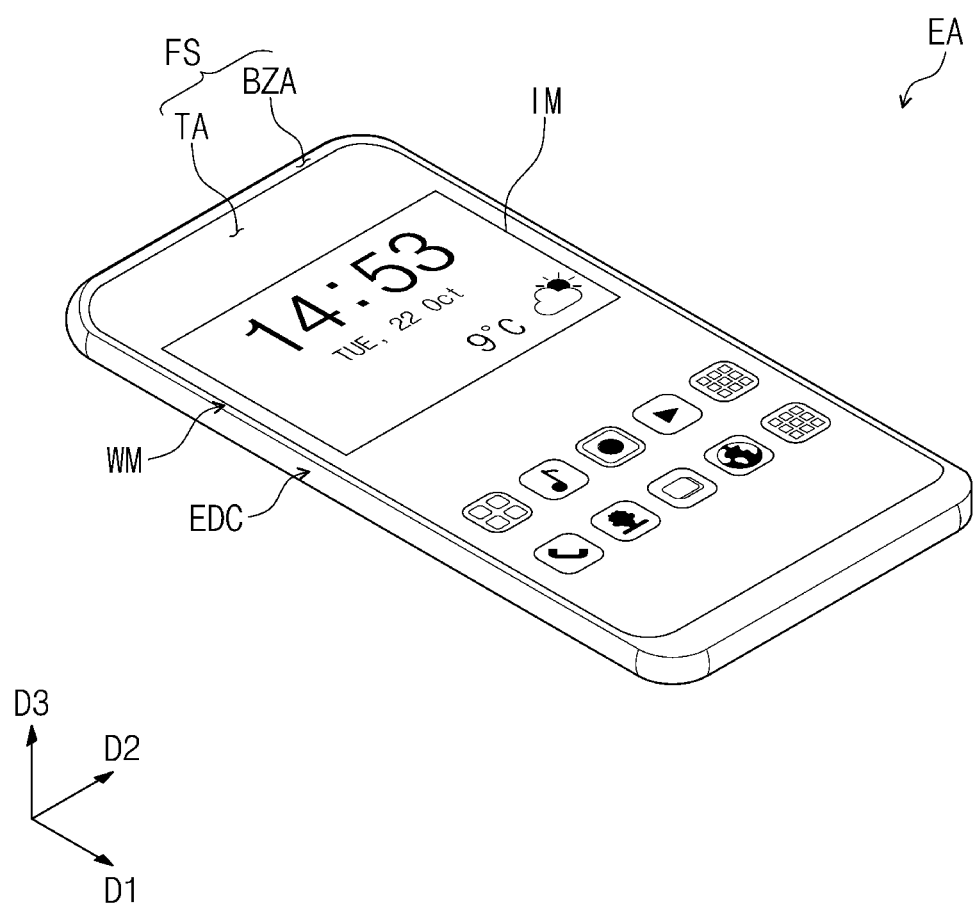
FIG. 1 is an assembled perspective view showing a display device according to some example embodiments of the present disclosure.

In the following descriptions, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof. Hereinafter, the present disclosure will be explained in detail with reference to the accompanying drawings.

Figure 2:
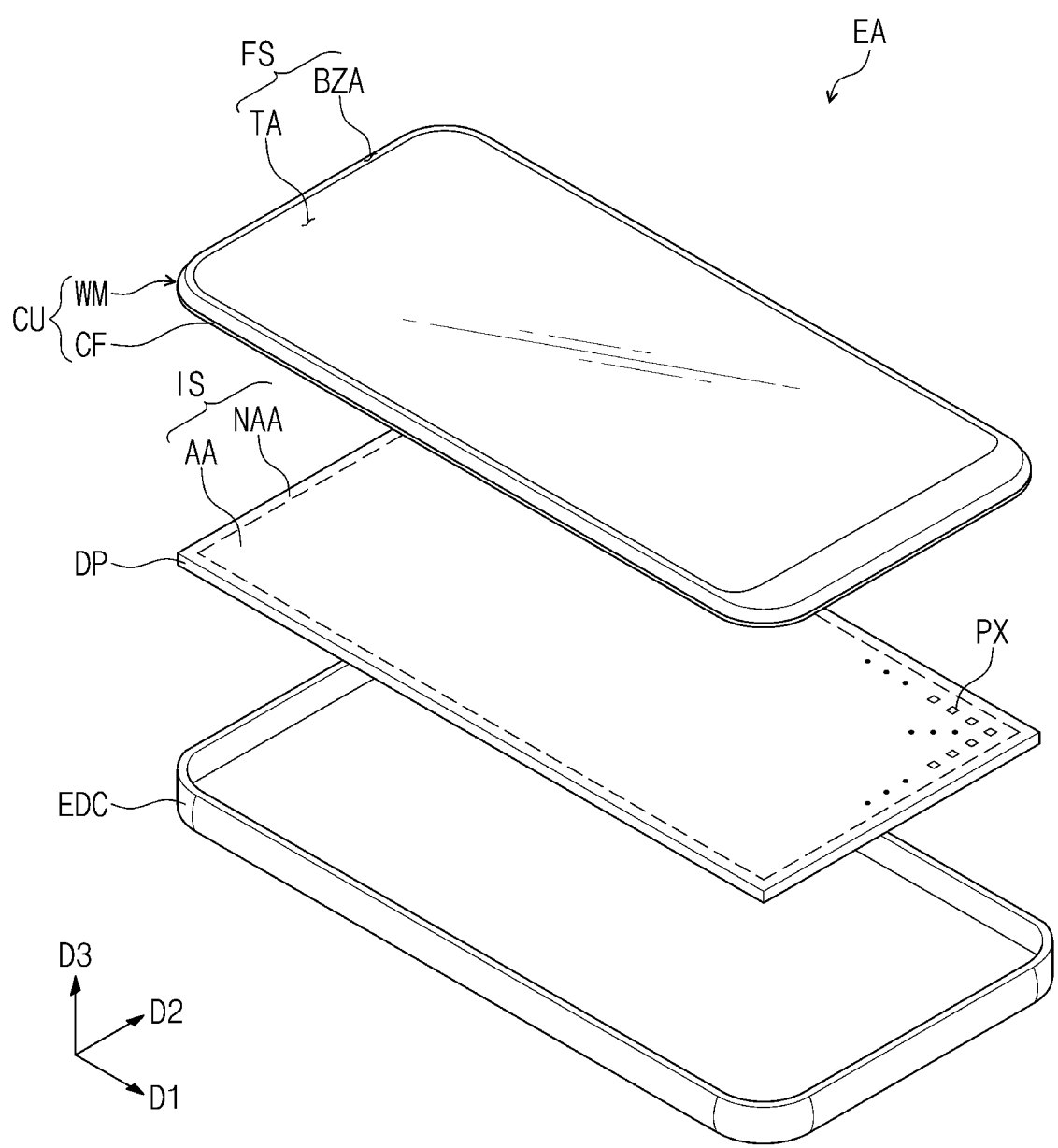
FIG. 2 is an exploded perspective view showing a display device according to some example embodiments of the present disclosure.
Figure 3:
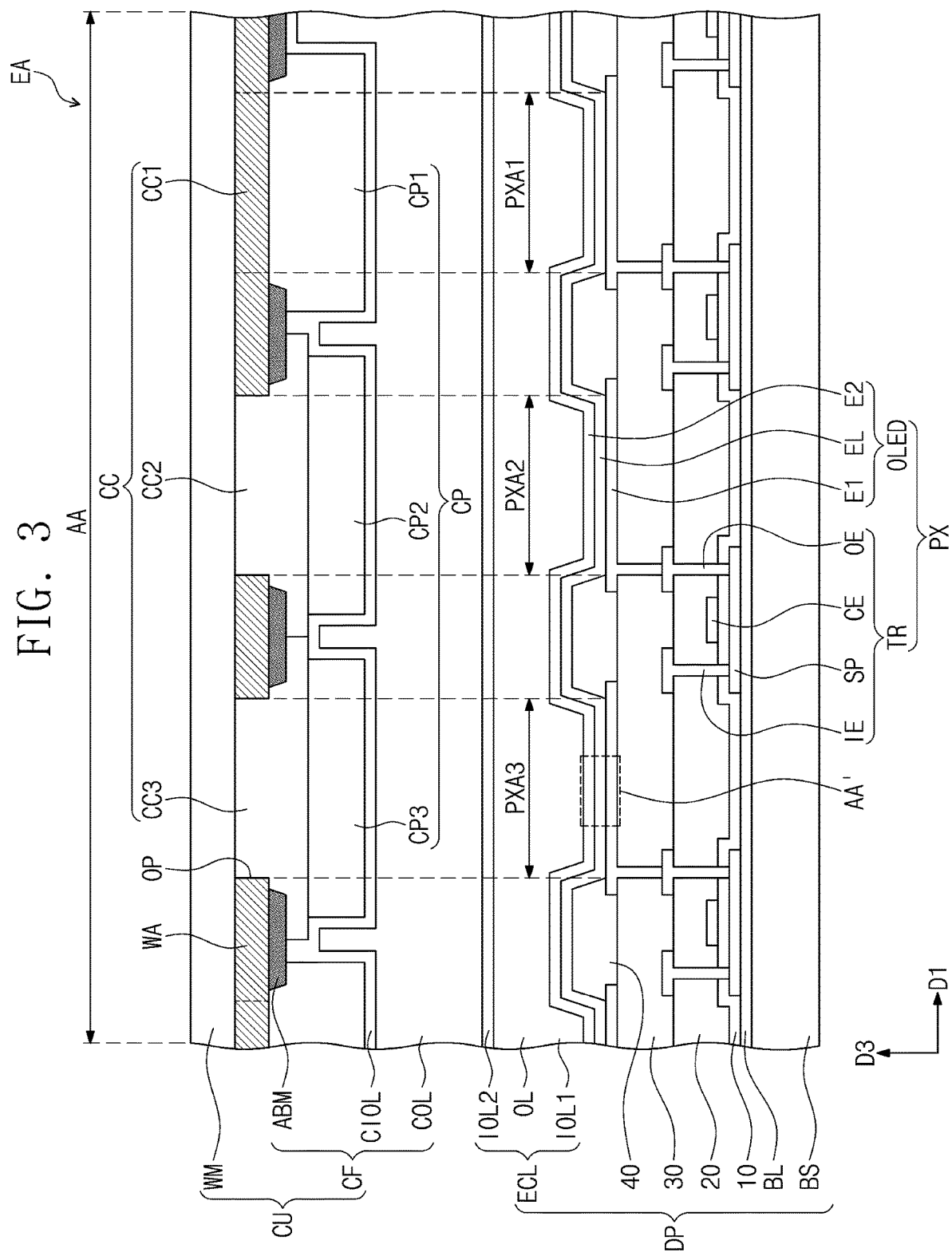
FIG. 3 is a cross-sectional view showing a display device according to some example embodiments of the present disclosure.

FIG. 1 is an assembled perspective view showing a display device EA according to some example embodiments of the present disclosure. FIG. 2 is an exploded perspective view showing the display device EA according to some example embodiments of the present disclosure. FIG. 3 is a cross-sectional view showing the display device EA according to some example embodiments of the present disclosure.

Referring to FIGS. 1 and 2, the display device EA displays an image IM to a third direction D3 on a plane defined by a first direction D1 and a second direction D2. The display device EA includes a cover panel CU, a display panel DP, and a cover case EDC.

The cover panel CU includes a window WM and a color control layer CF. The cover panel CU is located on the display panel DP to cover a front surface IS of the display panel DP. The window WM includes a front surface FS exposed to the outside. The images displayed by the display panel DP are perceived by viewers from the outside through the front surface FS.

The window WM may have a single-layer or multi-layer structure. For example, the window WM may include a stacked structure of a plurality of plastic films attached to each other by an adhesive or a stacked structure of a glass substrate and a plastic film attached to the glass substrate by an adhesive. The window WM may be optically transparent. For example, the window WM may include glass or plastic.

The front surface FS of the window WM may be divided into a transmissive area TA and a bezel area BZA in a plan view. The transmissive area TA may be an area that transmits a light provided from the display panel DP. The transmissive area TA may have a shape corresponding to an active area AA of the display panel DP. For example, the transmissive area TA may overlap an entire portion or at least a portion of the active area AA.

The bezel area BZA may be an area having a relatively lower transmittance as compared with the transmissive area TA. The bezel area BZA may define a shape of the transmissive area TA. For example, the transmissive area TA may be located within the bezel area BZA. The bezel area BZA may be located adjacent to or around the transmissive area TA and may have a closed line shape to surround the transmissive area TA.

The bezel area BZA may have a color (e.g., a set or predetermined color). The bezel area BZA may cover a peripheral area NAA (shown, for example, in FIG. 2) of the display panel DP to prevent or reduce visibility of the peripheral area NAA from the outside. For example, in a case where the light generated in the display panel DP leaks through the peripheral area NAA, the leaking light may be blocked by the bezel area BZA, and thus visibility of the peripheral area NAA from the outside may be prevented or reduced.

The color control layer CF is arranged on a rear surface of the window WM and converts a wavelength of the light provided to the transmissive area TA from the display panel DP. In addition, the color control layer CF reflects and absorbs the light provided to the bezel area BZA from the display panel DP.

The display panel DP displays the image IM through the front surface IS. The front surface IS is divided into the active area AA and the peripheral area NAA. The image IM is displayed through the active area AA. The peripheral area NAA is defined adjacent to (or outside of, for example, surrounding) the active area AA.

The display panel DP may include a plurality of pixels PX. The pixels PX display the light in response to an electrical signal. The image IM is implemented or displayed in the transmissive area TA by the light provided from the pixels PX through the color control layer CF.

The cover case EDC may be coupled to the cover panel CU. The cover case EDC provides a rear surface of the display device EA. The cover case EDC is coupled to the cover panel CU to provide an inner space. Components of the display panel DP may be accommodated in the inner space.

The cover case EDC may include a material having a rigidity (e.g., a set or predetermined rigidity). For example, the cover case EDC may include a plurality of frames and/or plates containing a glass, plastic, or metal material. The cover case EDC may stably protect the components of the display device EA accommodated in the inner space from external impacts.

Referring to FIG. 3, the cover panel CU is located on the display panel DP. The display panel DP includes a base layer BS, insulating layers BL, 10, 20, 30, and 40, an encapsulation layer ECL, and the pixel PX.

The base layer BS may be provided as a basement layer on which the components of the display panel DP are located. The base layer BS may include an insulating material. For example, the base layer BS may include a stacked film in which a glass, a resin film, or an organic layer and an inorganic layer are alternately stacked one another.

The pixel PX is provided in a plural number, and each of the pixels PX is configured to generate the light to enable the image IM to be implemented or displayed in the active area AA by the light passing through the cover panel CU. Each of the pixels PX may be connected to a plurality of signal lines. For example, the signal lines connected to each pixel PX may be a gate line and a data line.

An auxiliary layer BL may include an inorganic material. The auxiliary layer BL may include a barrier layer and/or a buffer layer. Therefore, the auxiliary layer BL may prevent or reduce instances of oxygen, moisture, or other contaminants introduced through the base layer BS infiltrating the pixel PX and/or may provide a surface energy lower than a surface energy of the base layer BS to allow the pixel PX to be relatively stably formed.

Meanwhile, the base layer BS and the auxiliary layer BL may be provided in a plural number, and the base layers BS and the auxiliary layers BL may be alternately stacked one on another. As another way, at least one of the barrier layer or the buffer layer of the auxiliary layer BL may be provided in a plural number or may be omitted, however, this is merely an example. The display panel DP according to some example embodiments of the present disclosure may have a variety of structures and should not be particularly limited.

The pixel PX may include a transistor TR and an organic light emitting diode OLED. The transistor TR may include a semiconductor pattern SP, a control electrode CE, an input electrode IE, and an output electrode OE.

The semiconductor pattern SP is arranged on the auxiliary layer BL. The semiconductor pattern SP includes a semiconductor material. The control electrode CE is spaced apart from the semiconductor pattern SP with a first insulating layer 10 interposed therebetween. The control electrode CE includes a conductive material. For example, the control electrode CE includes at least one of a metal material such as nickel (Ni), molybdenum (Mo), aluminum (Al), titanium (Ti), copper (Cu), or tungsten (W), or metal oxide.

The input electrode IE and the output electrode OE are spaced apart from the control electrode CE with a second insulating layer 20 interposed therebetween. The input electrode IE and the output electrode OE respectively make contact with one side and the other side of the semiconductor pattern SP after penetrating through the first insulating layer 10 and the second insulating layer 20.

Each of the input electrode IE and the output electrode OE includes a conductive material. For example, each of the input electrode IE and the output electrode OE includes one of nickel (Ni), chromium (Cr), molybdenum (Mo), aluminum (Al), titanium (Ti), copper (Cu), tungsten (W), and alloys thereof. Each of the input electrode IE and the output electrode OE may have a single-layer or multi-layer structure.

A third insulating layer 30 is located on the second insulating layer 20 and covers the input electrode IE and the output electrode OE. Meanwhile, according to some example embodiments of the present disclosure, the semiconductor pattern SP may be located on the control electrode CE. As another way, the semiconductor pattern SP may be located on the input electrode IE and the output electrode OE. As another way, the input electrode IE and the output electrode OE may be located on the same layer as the semiconductor pattern SP and may be directly connected to the semiconductor pattern SP. The transistor TR according to some example embodiments of the present disclosure may have a variety of structures, and it should not be limited to a particular embodiment.

The organic light emitting diode OLED is arranged on the third insulating layer 30. The organic light emitting diode OLED may include a variety of elements as long as it may emit the light. The organic light emitting diode OLED includes a first electrode layer E1, a light emitting portion EL, and a second electrode layer E2.

The first electrode layer E1 may be connected to the transistor TR after penetrating through the third insulating layer 30. Meanwhile, although not shown in figures, the display panel DP may further include a separate connection electrode arranged between the first electrode layer E1 and the transistor TR, and in this case, the first electrode layer E1 may be connected to the transistor TR by the connection electrode.

The first electrode layer E1 may serve as a pixel electrode or an anode electrode. The first electrode layer E1 may be a transmissive electrode, a semi-transmissive electrode, or a reflective electrode. For example, the first electrode layer E1 may be the semi-transmissive electrode or the reflective electrode for a front surface light emission. In this case, the first electrode layer E1 may include Ag, Mg, Al, Pt, Pd, Au, Ni, Nd, Ir, Cr, or a metal compound.

In addition, the first electrode layer E1 may have a single layer structure of Ag, Mg, Al, Pt, Pd, Au, Ni, Nd, Ir, Cr, or a metal compound or may have a multi-layer structure of a metal layer containing Ag, Mg, Al, Pt, Pd, Au, Ni, Nd, Ir, Cr, or a metal compound and a transparent conductive oxide layer containing a transparent conductive oxide. In this case, the transparent conductive oxide may include, for example, indium tin oxide (ITO), indium zinc oxide (IZO), zinc oxide (ZnO), and indium tin zinc oxide (ITZO).

A fourth insulating layer 40 may be arranged on the third insulating layer 30. The fourth insulating layer 40 may include an organic material and/or an inorganic material and may have a single-layer or multi-layer structure. The fourth insulating layer 40 may be provided with an opening defined therethrough. At least a portion of the first electrode layer E1 is exposed through the opening. The fourth insulating layer 40 may be a pixel definition layer.

The portion of the first electrode layer E1 exposed through the opening may be defined as a light emitting area. Each of the pixels PX includes a corresponding light emitting area. FIG. 3 shows three light emitting areas PXA1, PXA2, and PXA3 as a representative example.

The light emitting portion EL may be located in the opening defined in the fourth insulating layer 40. The light emitting portion EL may cover the fourth insulating layer 40 and a plurality of first electrode layers E1 exposed without being covered by the fourth insulating layer 40. Accordingly, the light emitting portion EL may be formed on an entire surface of the base layer BS, however, it should not be limited thereto or thereby. The light emitting portion EL may be located on each first electrode layer E1 after being patterned.

The light emitting portion EL may include a light emitting material. For example, the light emitting portion EL may include at least one material among materials emitting red, green, or blue colors, respectively, and may include a fluorescent material or a phosphorescent material. The light emitting portion EL may include an organic light emitting material or an inorganic light emitting material. The light emitting portion EL may emit the light in response to a difference in electric potential between the first electrode layer E1 and the second electrode layer E2.

The second electrode layer E2 may be located on the light emitting portion EL. The second electrode layer E2 may face the first electrode layer E1. The second electrode layer E2 may have an integral shape extending to the peripheral area NAA from the active area AA. The second electrode layer E2 may be commonly provided to the pixels PX. The organic light emitting diode OLED arranged in each pixel PX may receive a common power supply voltage (hereinafter, referred to as a "second power supply voltage") through the second electrode layer E2.

The second electrode layer E2 may be a common electrode or a cathode electrode. The second electrode layer E2 may be a transmissive electrode, a semi-transmissive electrode, or a reflective electrode. As an example, the second electrode layer E2 may be the transmissive electrode for the front surface light emission. In this case, the second electrode layer E2 may include Li, Ca, LiF/Ca, LiF/Al, Al, Mg, BaF, Ba, Ag, a compound thereof, or a mixture thereof, e.g., a mixture of Ag and Mg. In addition, the second electrode layer E2 may include a transparent metal oxide, for example, indium tin oxide (ITO), indium zinc oxide (IZO), zinc oxide (ZnO), and indium tin zinc oxide (ITZO). Different from the above, the second electrode layer E2 may be the semi-transmissive electrode or the reflective electrode for a rear surface light emission. In this case, the second electrode layer E2 may include Ag, Mg, Al, Pt, Pd, Au, Ni, Nd, Ir, Cr, or a metal compound. The second electrode layer E2 may have a multi-layer structure of a reflective layer or a semi-transmissive layer, which is formed of the above materials, and a transparent conductive layer formed of indium tin oxide (ITO), indium zinc oxide (IZO), zinc oxide (ZnO), indium tin zinc oxide (ITZO), etc.

The encapsulation layer ECL may be located on the organic light emitting diode OLED to encapsulate the organic light emitting diode OLED. The encapsulation layer ECL may be commonly provided to the pixels PX. According to some example embodiments, a capping layer may be further located between the second electrode layer E2 and the encapsulation layer ECL to cover the second electrode layer E2.

The encapsulation layer ECL may include a first inorganic layer IOL1, an organic layer OL, and a second inorganic layer IOL2, which are sequentially stacked in the third direction D3, however, it should not be limited thereto or thereby. That is, the encapsulation layer ECL may further include a plurality of inorganic layers and a plurality of organic layers.

The first inorganic layer IOL1 may cover the second electrode layer E2. The first inorganic layer IOL1 may prevent external moisture or oxygen from entering the organic light emitting diode OLED. For example, the first inorganic layer IOL1 may include silicon nitride, silicon oxide, or a compound thereof. The first inorganic layer IOL1 may be formed by a deposition process.

The organic layer OL may be arranged on the first inorganic layer IOL1 to make contact with the first inorganic layer IOL1. The organic layer OL may provide a flat surface on the first inorganic layer IOL1. An uneven shape formed on the upper surface of the first inorganic layer IOL1 and particles existing on the first inorganic layer IOL1 may be covered by the organic layer OL, and thus, a surface state of the upper surface of the first inorganic layer IOL1 may be prevented from exerting an influence on components formed on the organic layer OL.

In addition, the organic layer OL may relieve stress between the layers in contact. The organic layer OL may include an organic material and may be formed by a solution process, such as a spin coating, slit coating, or inkjet process.

The second inorganic layer IOL2 may be arranged on the organic layer OL to cover the organic layer OL. The second inorganic layer IOL2 may be stably formed on a relatively flat surface of the organic layer OL rather than being arranged on the first inorganic layer IOL1. The second inorganic layer IOL2 may encapsulate moisture leaked from the organic layer OL to prevent or reduce moisture or other contaminants from entering from the outside. The second inorganic layer IOL2 may include silicon nitride, silicon oxide, or a compound thereof. The second inorganic layer IOL2 may be formed by any suitable deposition process.

The cover panel CU may be located on the encapsulation layer ECL. According to some example embodiments, the cover panel CU may further include a planarization layer COL located on the second inorganic layer IOL2.

The planarization layer COL covers the encapsulation layer ECL providing an uneven surface and provides a flat surface on the active area AA, however, this is merely an example. In the cover panel CU according to some example embodiments of the present disclosure, the planarization layer COL may be provided in a plural number or may be omitted.

The color control layer CF may be located on the planarization layer COL. The color control layer CF includes a barrier layer WA, a reflective layer CC, a light blocking layer ABM, and a color filter layer CP.

The barrier layer WA may be arranged on the window WM. For example, the barrier layer WA may be arranged on the rear surface of the window WM, that is, a surface opposite to the front surface FS (refer to FIG. 1) of the window WM. The barrier layer WA located on the rear surface of the window WM may prevent or reduce visibility of the components of the display panel DP at the front surface FS of the window WM. The barrier layer WA may include an organic material that blocks the light. The barrier layer WA may have a color (e.g., a set or predetermined color).

The barrier layer WA may be provided with a plurality of openings OP defined therethrough. At least portions of the rear surface of the window WM may be exposed through the openings OP of the barrier layer WA. The openings OP may overlap the corresponding light emitting areas PXA1, PXA2, and PXA3 of the display panel DP.

The reflective layer CC may be arranged on the rear surface of the window WM. The reflective layer CC and the barrier layer WA may prevent or reduce visibility of components of the display panel DP at the front surface FS of the window WM.

The reflective layer CC may include first, second, and third reflective patterns CC1, CC2, and CC3. Each of the first, second, and third reflective patterns CC1, CC2, and CC3 may be arranged in a corresponding opening among the openings OP. The first, second, and third reflective patterns CC1, CC2, and CC3 may respectively correspond to the light emitting areas PXA1, PXA2, and PXA3 of the display panel DP.

The first, second, and third reflective patterns CC1, CC2, and CC3 may block or transmit the lights having different colors from each other. For example, the first reflective pattern CC1 may transmit only a blue light, the second reflective pattern CC2 may block the blue light and may transmit only a red light, and the third reflective pattern CC3 may block the blue light and may transmit only a green light.

The first, second, and third reflective patterns CC1, CC2, and CC3 may respectively include organic materials that block the lights having different colors from each other. The first, second, and third reflective patterns CC1, CC2, and CC3 may have different colors from each other. For example, the first reflective pattern CC1 may have a blue color, the second reflective pattern CC2 may have a red color, and the third reflective pattern CC3 may have a green color.

According to some example embodiments, the first reflective pattern CC1 may be formed through the same process as the barrier layer WA. Accordingly, the first reflective pattern CC1 may include the same material as and may have the same color as the barrier layer WA. In addition, an upper surface of the first reflective pattern CC1 and an upper surface of the barrier layer WA may define the same plane. Further, the barrier layer WA may have various widths in a cross-section. For example, because the first reflective pattern CC1 may be a pattern extending from the barrier layer WA, a width in one direction of the barrier layer arranged together with the first reflective pattern CC1 may be greater than a width in the one direction of the barrier layer arranged between the second and third reflective patterns CC2 and CC3.

The light blocking layer ABM is arranged on the barrier layer WA. The barrier layer WA does not overlap the light emitting areas PXA1, PXA2, and PXA3. According to some example embodiments, the light blocking layer ABM may have a tapered shape in a cross-section.

The light blocking layer ABM is arranged between the light emitting areas PXA1, PXA2, and PXA3 to absorb the light leaking to another light emitting area. The light blocking layer ABM includes a material that does not transmit the light. For example, the light blocking layer ABM may include a metal including at least one of chromium (Cr), copper (Cu), silver (Ag), molybdenum (Mo), nickel (Ni), titanium (Ti), and tantalum (Ta), a metal oxide, or an organic material. According to some example embodiments of the present disclosure, the light blocking layer ABM may be arranged between the light emitting areas PXA1, PXA2, and PXA3 of the display panel DP and may prevent a color mixture between the light emitting areas PXA1, PXA2, and PXA3 different from each other.

The color filer layer CP may improve a color reproducibility of the light provided from the display panel DP. The color filter layer CP may include first, second, and third color patterns CP1, CP2, and CP3. Each of the first, second, and third color patterns CP1, CP2, and CP3 may be arranged to overlap a corresponding reflective pattern among first, second, and third reflective patterns CC1, CC2, and CC3. For example, the first color pattern CP1 is arranged on the first reflective pattern CC1. The second color pattern CP2 is arranged on the second reflective pattern CC2, and the third color pattern CP3 is arranged on the third reflective pattern CC3.

The first color pattern CP1 according to some example embodiments of the present disclosure may display substantially the same color as the light provided from the display panel DP. For example, the blue light generated by the display panel DP may transmit through the first color pattern CP1. The first color pattern CP1 corresponding to an area emitting the blue light may include a material that transmits the blue light incident thereto without separate phosphors or quantum dots. The first color pattern CP1 may further include scattering particles. For example, the first color pattern CP1 may include a polymer, such as titanium dioxide ($TiO_2$) and a photosensitive resin, or at least one of a blue dye or a blue pigment, however, the first color pattern CP1 may include a variety of materials as long as the materials scatter the blue light without converting the blue light.

Each of the second color pattern CP2 and the third color pattern CP3 may include the quantum dot that converts the light. A core of the quantum dot may be selected from a group II-VI compound, a group III-V compound, a group IV-VI compound, a group IV element, a group IV compound, and/or a combination thereof.

The group II-VI compound may be selected from a binary compound selected from the group consisting of CdSe, CdTe, ZnS, ZnSe, ZnTe, ZnO, HgS, HgSe, HgTe, MgSe, MgS, and a mixture thereof, a ternary compound selected from the group consisting of AgIns, CuIns, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof, and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI compound may be selected from a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The group IV element may be selected from the group consisting of Si, Ge, and a mixture thereof. The group IV compound may be a binary compound selected from the group consisting of SiC, SiGe, and a mixture thereof.

In this case, the binary compound, the ternary compound, or the quaternary compound may exist in the particles at a uniform concentration or may exist in the same particle after being divided into plural portions having different concentrations. In addition, the quantum dots may have a core-shell structure where one quantum dot surrounds another quantum dot. An interface between the core and the shell may have a concentration gradient in which a concentration of elements existing in the shell is lowered as a distance from a center decreases.

In some embodiments, the quantum dot may have the core-shell structure including the core containing the above-mentioned nanocrystals and the shell surrounding the core. The shell of the quantum dot may serve as a protective layer to prevent chemical modification of the core and to maintain semiconductor properties and/or as a charging layer to impart electrophoretic properties to the quantum dot. The shell may have a single-layer of multi-layer structure. The interface between the core and the shell may have the concentration gradient in which the concentration of elements existing in the shell is lowered as the distance from the center of the shell decreases. As the shell of the quantum dot, oxides of metals or nonmetals, semiconductor compounds, or combinations thereof may be used.

For example, the oxides of the metals or nonmetals may be binary elements, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, and $Co_3O_4$, NiO, or ternary elements, such as $MgAl_2O_4$, $CoFe_2O_4$, $NiFe_2O_4$, and $CoMn_2O_4$, however, the present disclosure should not be limited thereto or thereby.

The semiconductor compounds may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, however, embodiments according to the present disclosure should not be limited thereto or thereby.

The quantum dot may have a full width at half maximum (FWHM) of the light emitting wavelength spectrum, which is about 45 nm or less, or according to some example embodiments about 40 nm or less, or according to some example embodiments about 30 nm or less, and a color purity or a color reproducibility may be improved in the above-mentioned ranges. In addition, because the light emitted through the quantum dot travels in all directions, an optical viewing angle may be improved.

In addition, the quantum dot should not be limited to a specific shape. In detail, the quantum dot may have a variety of shapes, e.g., a globular shape, a pyramid shape, a multi-arm shape, a cubic nano-particle, a nano-tube, a nano-wire, a nano-fabric, and a nanoplate-shaped particle. The color of the light emitted from the quantum dot may be changed in accordance with the particle size. Therefore, the quantum dot may have a variety of light emitting colors, such as the blue, red, or green color.

In addition, the second color pattern CP2 and the third color pattern CP3 may include phosphors to convert the light exiting from the display panel DP and the light exiting from the organic light emitting diode OLED to different lights from each other. For example, the second color pattern CP2 may include the phosphors that absorb the blue light exiting from the display panel DP and emitting the red light. The red phosphors may be one material of (Ca, Sr, Ba)S, (Ca, Sr, Ba)$_2Si_5N_8$, $CaLaSiN_3$, $CaMoO_4$, or $Eu_2Si_5N_8$. The third color pattern CP3 may include the phosphors that absorb the blue light exiting from the organic light emitting diode OLED and emitting the green light. The green phosphors may be at least one material of yttrium aluminum garnet (YAG), (Ca, Sr, Ba)2SiO4, SrGa2S4, BAM, alpha sialon (α-SiAlON), beta sialon (β-SiAlON), Ca3Sc2Si3O12, Tb3Al5O12, BaSiO4, CaAlSiON, or (Sr1-xBax)Si2O2N2.

The cover panel CU according to some example embodiments may further include a cover inorganic layer CIOL. The cover inorganic layer CIOL may be arranged on the entire surface of the window WM. The cover inorganic layer CIOL may be arranged on the color filter layer CP to partition the first, second, and third color patterns CP1, CP2, and CP3. The cover inorganic layer CIOL may include at least one of silicon oxide (SiOx) or silicon nitride (SiNx). The cover inorganic layer CIOL may prevent or reduce oxygen, moisture, or other contaminants from entering the color filter layer CP.

Figure 4:
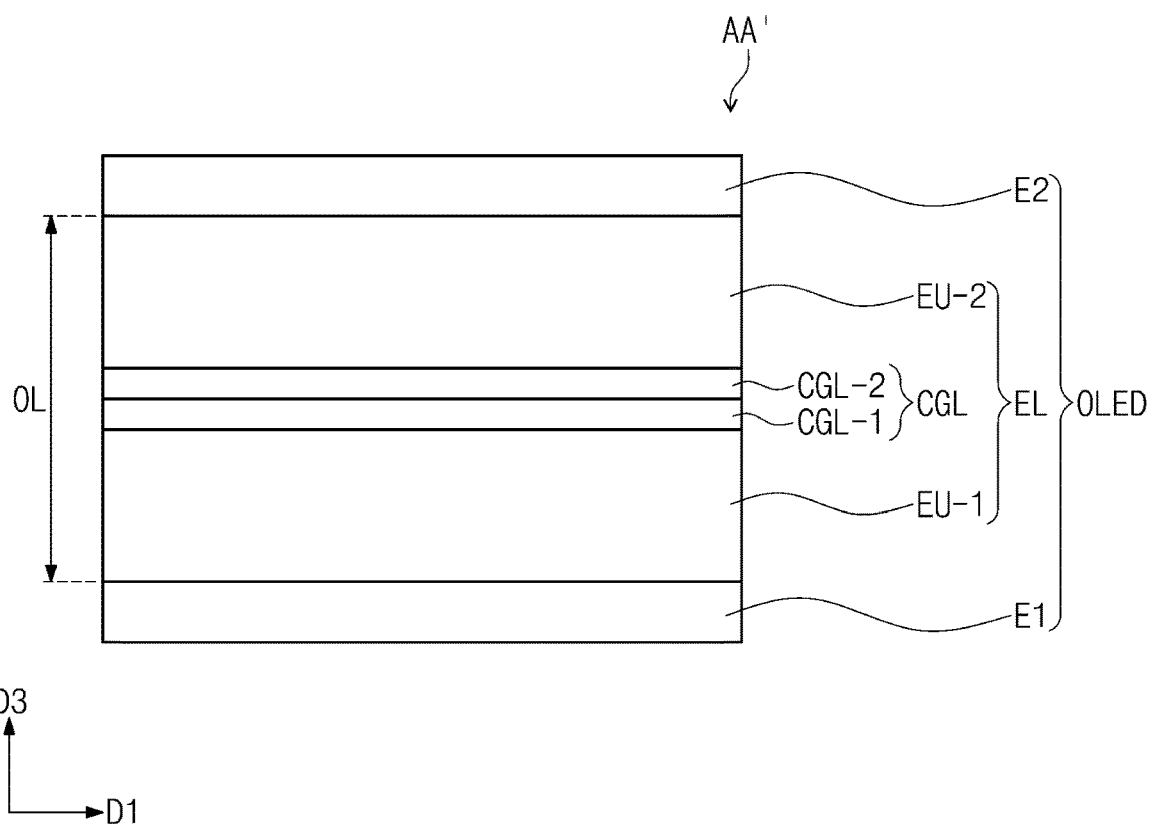
FIG. 4 is an enlarged view showing an area AA' of FIG. 3.
Figure 5:
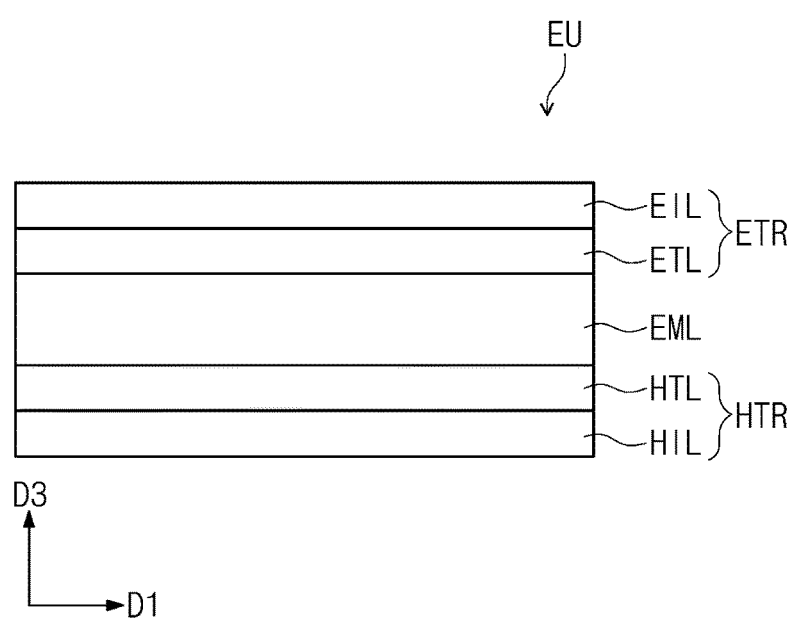
FIG. 5 is a cross-sectional view showing a light emitting unit according to some example embodiments of the present disclosure.
Figure 6:
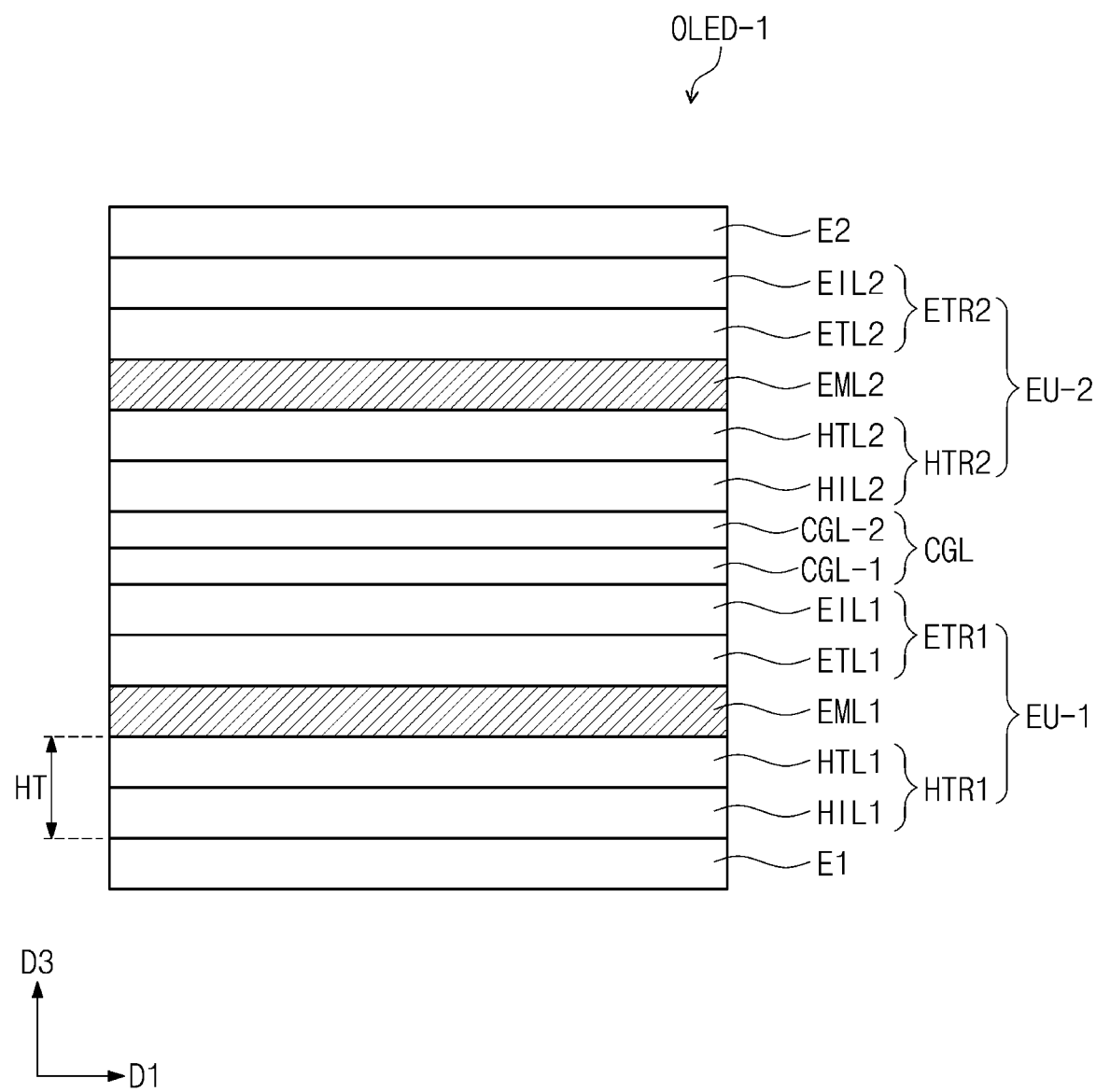
FIG. 6 is a cross-sectional view showing a stacked structure of an organic light emitting diode according to some example embodiments of the present disclosure.

FIG. 4 is an enlarged view showing an area AA' of FIG. 3. FIG. 5 is a cross-sectional view showing a light emitting unit EU according to some example embodiments of the present disclosure. FIG. 6 is a cross-sectional view showing a stacked structure of the organic light emitting diode OLED according to some example embodiments of the present disclosure.

Referring to FIG. 4, the organic light emitting diode OLED includes the first electrode layer E1, the light emitting portion EL including a plurality of light emitting units EU-1 and EU-2, and the second electrode layer E2. The light emitting portion EL includes a first light emitting unit EU-1, a second light emitting unit EU-2, and a charge generating layer CGL.

The first light emitting unit EU-1 may emit a first light in a first wavelength range, and the second light emitting unit EU-2 may emit a second light in a second wavelength range. The first and the second light emitting units EU-1 and EU-2 may emit lights having different wavelength ranges from each other, or may emit light having the same wavelength range, or may emit lights whose wavelength ranges are at least partially overlapping.

For example, in a case where the light emitting units EU-1 and EU-2 emit the lights having different wavelength ranges from each other, the number and the stack order of the light emitting units EU-1 and EU-2, according to some example embodiments, is not be particularly limited as long as the lights respectively emitted from the light emitting units EU-1 and EU-2 are mixed with each other and a white light is generated.

In addition, the wavelength ranges of the first and second lights respectively emitted from the light emitting units EU-1 and EU-2 are substantially the same as each other or partially overlap each other, the first and the second lights may be the blue light. In addition, when the lights generated by the light emitting units EU-1 and EU-2 are the blue light, the number and the stack order of the light emitting units EU-1 and EU-2, according to some example embodiments, is not be particularly limited.

The organic light emitting diode OLED has an optical length (e.g., a set or predetermined optical length) OL. The optical length OL may be a distance at which the light generated by the organic light emitting diode OLED is reflected from reflective interfaces and resonates.

The reflective interfaces may be defined on a surface of the first electrode layer E1 and a surface of the second electrode layer E2. Accordingly, the optical length OL may be defined as a minimum distance from an interface between the first electrode layer E1 and a layer making contact with the first electrode layer E1 and an interface between the second electrode layer E2 and a layer making contact with the second electrode layer E2.

According to some example embodiments, the optical length OL may be determined by a distance from an interface between the first electrode layer E1 and the first light emitting unit EU-1 and an interface between the second electrode layer E2 and the second light emitting unit EU-2.

The optical length OL may be a distance at which the blue light resonates. According to some example embodiments, the first electrode layer E1 may be the reflective electrode, and the organic light emitting diode OLED may have the front surface light emission structure. In this case, the optical length OL may be equal to or greater than about 2500 angstroms (Å) and equal to or smaller than about 5000 angstroms (Å).

FIG. 4 shows only the first light emitting unit EU-1 and the second light emitting unit EU-2, however, three or more light emitting units may be arranged between the first electrode layer E1 and the second electrode layer E2. This will be described in more detail later with reference to FIGS. 7 and 8.

FIG. 5 shows a layer structure of the light emitting units EU-1 and EU-2 as the light emitting unit EU. The light emitting unit EU according to some example embodiments of the present disclosure may include a hole control layer HTR, an electron control layer ETR, and a light emitting layer EML located between the hole control layer HTR and the electron control layer ETR.

The hole control layer HTR according to some example embodiments of the present disclosure may include at least one of a hole injection layer HIL or a hole transport layer HTL. According to some example embodiments, the hole transport layer HTL may include at least one of a hole buffer layer or an electron blocking layer.

The hole control layer HTR may have a single-layer structure of a single material or plural different materials, or a multi-layer structure of layers formed of different materials. For example, as shown in FIG. 5, the hole control layer HTR may have a structure in which the hole injection layer HIL and the hole transport layer HTL are sequentially stacked in the third direction D3.

However, according to some example embodiments, the hole control layer HTR may have a variety of stacked structures of hole injection layer/hole transport layer/hole buffer layer, hole injection layer/hole buffer layer, hole transport layer/hole buffer layer, or hole injection layer/hole transport layer/electron blocking layer, which are sequentially stacked in the third direction D3.

The hole control layer HTR may be formed by a general method known in the art. For example, the hole control layer HTR may be formed by various methods, such as a vacuum deposition method, a spin coating method, a cast method, an LB (Langmuir-Blodgett) method, an inkjet printing method, a laser printing method, an LITI (Laser Induced Thermal Imaging) method, etc.

In the case where the hole control layer HTR includes the hole injection layer HIL, the hole control layer HTR may include, but is not limited to including, a phthalocyanine compound such as copper phthalocyanine, DNTPD (N,N'-diphenyl-N,N'-bis-[4-(phenyl-m-tolyl-amino)-phenyl]-biphenyl-4,4'-diamine), m-MTDATA(4,4',4"-tris(3-methylphenylphenylamino)triphenylamine), TDATA(4,4'4"-Tris (N,N-diphenylamino)triphenylamine), 2TNATA(4,4',4"-tris{N,-(2-naphthyl)-N-phenylamino}-triphenylamine), PEDOT/PSS(Poly(3,4-ethylenedioxythiophene)/Poly(4-styrenesulfonate)), PANI/DBSA(Polyaniline/Dodecylbenzenesulfonic acid), PANI/CSA(Polyaniline/Camphor sulfonicacid), PANI/PSS((Polyaniline)/Poly(4-styrenesulfonate)), etc.

In the case where the hole control layer HTR includes the hole transport layer HTL, the hole control layer HTR may include, but is not limited to including, carbazole-based derivatives, e.g., n-phenyl carbazole, polyvinyl carbazole, etc., fluorine-based derivatives, triphenylamine-based derivatives, e.g., TPD(N,N'-bis(3-methylphenyl)-N,N'-diphenyl-[1,1-biphenyl]-4,4'-diamine), TCTA(4,4',4''-tris(N-carbazolyl)triphenylamine), etc., NPB(N,N'-di(1-naphthyl)-N,N'-diphenylbenzidine), TAPC(4,4 is [N,N-bis(4-methylphenyl)benzenamine]), etc.

As described above, the hole control layer HTR may further include at least one of the hole buffer layer or the electron blocking layer in addition to the hole injection layer HIL and the hole transport layer HTL. The hole buffer layer may compensate for a resonance distance according to the wavelength of the light emitted from the light emitting layer EML to increase a light emission efficiency. As a material included in the hole buffer layer, a material that may be included in the hole transport layer HTL may be used. The electron blocking layer may prevent or reduce instances of the electrons being injected into the hole transport layer HTL from an electron transport layer described in more detail below.

The electron control layer ETR may include at least one of an electron injection layer EIL or an electron transport layer ETL. According to some example embodiments, the electron control layer ETR may further include a hole blocking layer.

The electron control layer ETR may be formed by a general method known in the art. For example, the electron control layer ETR may be formed by various methods, such as a vacuum deposition method, a spin coating method, a cast method, an LB (Langmuir-Blodgett) method, an inkjet printing method, a laser printing method, an LITI (Laser Induced Thermal Imaging) method, etc.

In a case where the electron control layer ETR includes the electron transport layer ETL, the electron control layer ETR may include Alq3(Tris(8-hydroxyquinolinato)aluminum), TPBi(1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato)aluminum), Bebq2(berylliumbis(benzoquinolin-10-olate)), ADN(9,10-di(naphthalene-2-yl) anthracene), and compounds thereof.

In addition, in a case where the electron control layer ETR includes the electron injection layer EIL, the electron control layer ETR may include a lanthanide-based metal, e.g., LiF, LiQ (Lithium quinolate), $Li_2O$, BaO, NaCl, CsF, Yb, etc., or a metal halide, e.g., RbCl, RbI, etc., but it should not be limited thereto or thereby. The electron injection layer EIL may include a mixture of an electron transport material and an organo metal salt with insulating property. The organo metal salt may have an energy band gap of about 4 eV or more. In detail, the organo metal salt may include metal acetate, metal benzoate, metal acetoacetate, metal acetylacetonate, or metal stearate.

As described above, in the case where the electron control layer ETR further includes the hole blocking layer, the hole blocking layer may include at least one of, for example, BCP(2,9-dimethyl-4,7-diphenyl-1,10-phenanthroline) or Bphen(4,7-diphenyl-1,10-phenanthroline), superior hole blocking characteristics may be obtained without raising the driving voltage.

The light emitting layer EML according to some example embodiments of the present disclosure may include a host material and a dopant material. The light emitting layer EML may be formed by applying a fluorescent material or a phosphorescent material to the host material as the dopant.

As the host material, for example, Alq3(tris(8-hydroxyquinolino)aluminum), CBP(4,4'-bis(N-carbazolyl)-1,1'-biphenyl), PVK(poly(n-vinylcabazole)), ADN(9,10-di(naphthalene-2-yl)anthracene), TCTA(4,4',4''-Tris(carbazol-9-yl)-triphenylamine), TPBi(1,3,5-tris(N-phenylbenzimidazole-2-yl)benzene), TBADN(3-tert-butyl-9,10-di(naphth-2-yl) anthracene), DSA(distyrylarylene), CDBP(4,4'-bis(9-carbazolyl)-2,2''-dimethyl-biphenyl) MADN(2-Methyl-9,10-bis(naphthalen-2-yl)anthracene) may be used, however, it should not be limited thereto or thereby.

The color of the light emitted from the light emitting layer EML may be determined by a combination of the host material and the dopant material. When the light emitting layer EML emits the red light, the light emitting layer EML may include a fluorescent material containing PBD:Eu (DBM)3(Phen)(tris(dibenzoylmethanato)phenanthoroline europium) or Perylene.

As the dopant material included in the light emitting layer EML when the light emitting layer EML emits the red light, a metal complex, such as PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium), PtOEP(octaethylporphyrin platinum), etc., or organometallic complex may be used.

In addition, when the light emitting layer EML emits the green light, the light emitting layer EML may include a fluorescent material containing Alq3(Tris(8-hydroxyquinolino)aluminum). As the dopant material included in the light emitting layer EML when the light emitting layer EML emits the green light, a metal complex, e.g., Ir(ppy)3(fac-tris(2-phenylpyridine)iridium), or organometallic complex may be used.

In addition, as an example, when the light emitting layer EML emits the blue light, the light emitting layer EML may include a fluorescent material including any one selected from the groups consisting of spiro-DPVBi, spiro-6P, DSB (distyryl-benzene), DSA(distyryl-arylene), PFO(Polyfluorene)-based polymer, and PPV(poly(p-phenylene vinylene)-based polymer. When the light emitting layer EML emits the blue light, the dopant material included in the light emitting layer EML may be selected from a metal complex, such as (4,6-F2ppy)2Irpic, or organometallic complex.

The light emitting layer EML according to some example embodiments of the present disclosure may be formed by various methods, such as a vacuum deposition method, a spin coating method, a cast method, an LB (Langmuir-Blodgett) method, an inkjet printing method, a laser printing method, an LITI (Laser Induced Thermal Imaging) method, etc.

According to some example embodiments of the present disclosure, the charge generating layer CGL may be arranged between the first light emitting unit EU-1 and the second light emitting unit EU-2. When a voltage is applied, the charge generating layer CGL may generate electric charges (electrons and holes) by forming a complex through an oxidation-reduction reaction. The charge generating layer CGL may provide the generated charges to the light emitting units EU-1 and EU-2. The charge generating layer CGL may increase a current efficiency generated in one light emitting unit EU by two times and may adjust a balance of charges between the first light emitting unit EU-1 and the second light emitting unit EU-2.

For example, the charge generating layer CGL may have a layer structure in which a lower charge generating layer CGL-1 and an upper charge generating layer CGL-2 are attached to each other. The lower charge generating layer CGL-1 may be an n-type charge generating layer located adjacent to the first light emitting unit EU-1 to provide electrons to the first light emitting unit EU-1. The lower charge generating layer CGL-1 may include an aryl amine-based organic compound. For example, the aryl amine-based organic compound may be α-NPD, 2-TNATA, TDATA, MTDATA, sprio-TAD, or sprio-NPB.

The upper charge generating layer CGL-2 may be a p-type charge generating layer arranged adjacent to the second light emitting unit EU-2 to provide holes to the second light emitting unit EU-2. According to some example embodiments, a buffer layer may be further arranged between the lower charge generating layer CGL-1 and the upper charge generating layer CGL-2. The upper charge generating layer CGL-2 may include a charge generating compound containing a metal, an oxide of a metal, a carbide, a fluoride, or a mixture thereof. For example, the metal may be cesium (Cs), molybdenum (Mo), vanadium (V), titanium (Ti), tungsten (W), barium (Ba), or lithium (Li). Also, for example, the oxide of the metal, carbide, and fluoride may be Re2O7, MoO3, V2O5, WO3, TiO2, Cs2CO3, BaF, LiF, or CsF.

FIG. 6 shows a stacked structure obtained by applying components of the light emitting unit EU shown in FIG. 5 to each of the light emitting units EU-1 and EU-2 shown in FIG. 4.

An organic light emitting diode OLED-1 according to some example embodiments of the present disclosure includes a first electrode layer E1, a first light emitting unit EU-1, a charge generating layer CGL, a second light emitting unit EU-2, and a second electrode layer E2, which are sequentially stacked in the third direction D3.

The first light emitting unit EU-1 includes a first hole control layer HTR1, a first light emitting layer EML1, and a first electron control layer ETR1. The second light emitting unit EU-2 includes a second hole control layer HTR2, a second light emitting layer EML2, and a second electron control layer ETR2.

The charge generating layer CGL may be arranged between the first light emitting unit EU-1 and the second light emitting unit EU-2.

In the following descriptions, a hole control layer arranged closest to the first electrode layer E1 in the third direction D3 is defined as the "first hole control layer HTR1", and a light emitting layer arranged closest to the first hole control layer HTR1 in the third direction D3 is defined as the "first light emitting layer EML1".

In addition, a hole control layer arranged closest to the second electrode layer E2 in the third direction D3 is defined as the "second hole control layer HTR2", and a light emitting layer arranged closest to the second hole control layer HTR2 in the third direction D3 is defined as the "second light emitting layer EML2".

The first light emitting layer EML1 according to some example embodiments of the present disclosure may include a phosphorescent material. In addition, at least one light emitting layer(s) arranged on the first light emitting layer EML1 may include a fluorescent material. For example, the second light emitting layer EML2 arranged above the first light emitting layer EML1 may include the fluorescent material.

The phosphorescent material has a light emission efficiency higher than the fluorescent material but has a relatively short lifespan that is about one tenth (1/10) of the lifespan of the fluorescent material. The phosphorescent material that produces the blue light retains excitons formed during electron transition between phosphorescent components in a process of decomposing the excitons and accelerates deterioration of adjacent components, thereby shortening their lifespan rapidly.

In a case where the organic light emitting diode OLED-1 is a front surface light emission type, the first electrode layer E1 includes a metal material, for example, a material having a high light absorption rate, such as Ag, Mg, Al, Pt, Pd, Au, Ni, Nd, Ir, Cr, or a mixture thereof.

In this case, a portion of the light emitted from the first light emitting layer EML1 including the phosphorescent material is absorbed by the first electrode layer E1, and light loss is caused. However, a strong electric field is formed in the first electrode layer E1, and the lifespan of the excitons is shortened due to a decrease in density of state of photons. As the lifespan of the excitons is shortened, the lifespan of the light emitting layer increases. Therefore, the lifespan of the organic light emitting diodes OLED-1 may be improved.

According to some example embodiments of the present disclosure, in the organic light emitting diodes OLED and OLED-1 including the light emitting layers, although the first light emitting layer EML1, which is arranged closest to the first electrode layer E1 in the organic light emitting diodes OLED and OLED-1, includes the phosphorescent material, the lifespan of the organic light emitting diodes OLED and OLED-1 is not shortened, and the light emission efficiency may increase.

According to some example embodiments of the present disclosure, the first hole control layer HTR1 may have a thickness equal to or greater than about 100 angstroms and equal to or smaller than about 900 angstroms. When the thickness of the first hole control layer HTR1 is smaller than about 100 angstroms, the first hole control layer HTR1 may not satisfy a minimum thickness as a resonance region. In this case, because the light generated by the organic light emitting diode OLED-1 may not be reflected from the reflective interfaces and the thickness for the hole control may not be satisfied, a problem of reliability may be caused in the organic light emitting diode OLED-1.

When the thickness of the first hole control layer HTR1 exceeds about 900 angstroms, the first hole control layer HTR1 may not satisfy a maximum thickness as the resonance region. In this case, the light generated by the organic light emitting diode OLED-1 may not be resonated, a problem of reliability may be caused in the organic light emitting diode OLED-1.

Figure 7:
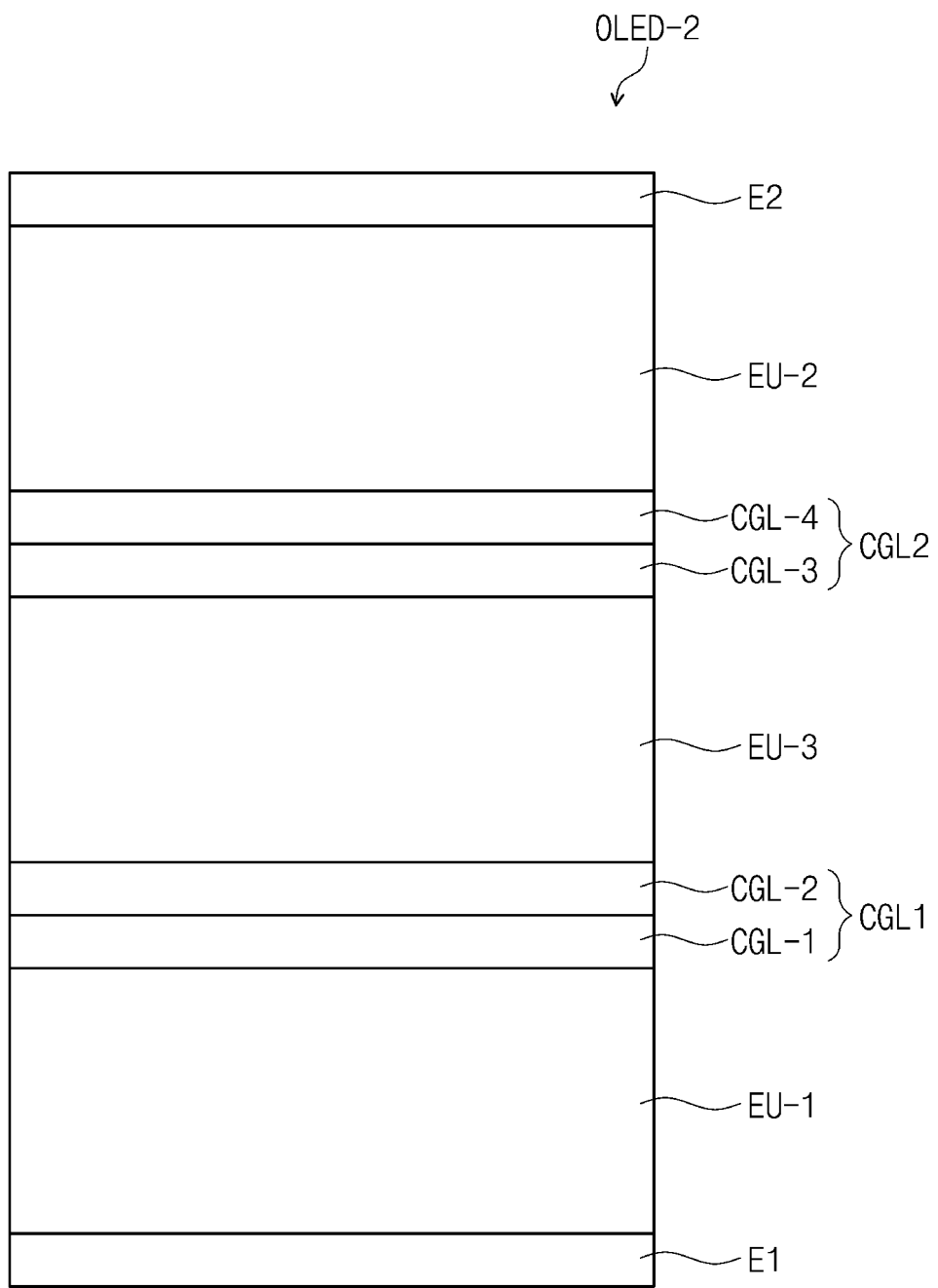
FIG. 7 is a cross-sectional view showing an organic light emitting diode including three light emitting units according to some example embodiments of the present disclosure.
Figure 8:
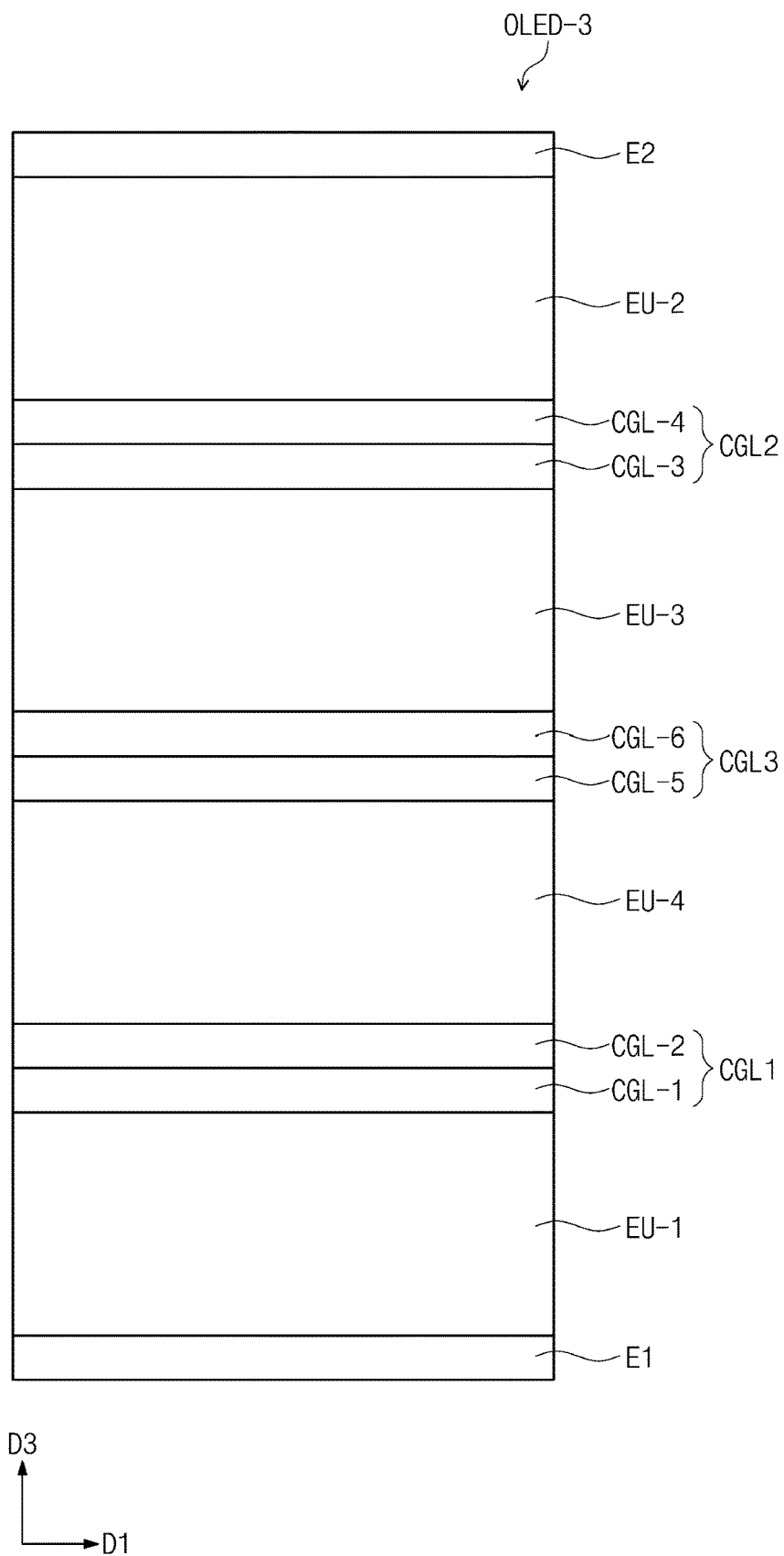
FIG. 8 is a cross-sectional view showing an organic light emitting diode including four light emitting units according to some example embodiments of the present disclosure.

FIG. 7 is a cross-sectional view showing an organic light emitting diode including three light emitting units according to some example embodiments of the present disclosure. FIG. 8 is a cross-sectional view showing an organic light emitting diode including four light emitting units according to some example embodiments of the present disclosure. In FIGS. 7 and 8, the same reference numerals denote the same elements as those in FIGS. 1 to 6, and thus, detailed descriptions of the same elements will be omitted.

Organic light emitting diode OLED-2 according to some example embodiments includes a plurality of light emitting units EU-1, EU-2, and EU-3 and a plurality of charge generating layers CGL1, CGL2.

Organic light emitting diode OLED-3 according to some example embodiments includes a plurality of light emitting units EU-1, EU-2, EU-3, and EU-4 and a plurality of charge generating layers CGL1, CGL2, and CGL3.

Each of the light emitting units EU-1, EU-2, EU-3, and EU-4 included in the organic light emitting diodes OLED-2 and OLED-3 include substantially the same configuration and function as those of the light emitting unit EU described with reference to FIG. 5, a first light emitting unit EU-1 of the organic light emitting diodes OLED-2 and OLED-3 arranged closest to a first electrode layer E1 includes a phosphorescent material in a light emitting layer as described in more detail with reference to FIG. 6.

The charge generating layers CGL1, CGL2, and CGL3 may have the same configuration and function as those of the charge generating layer CGL described with reference to FIG. 4. Lower charge generating layers CGL-1, CGL-3, and CGL-5 respectively included in the charge generating layers CGL1, CGL2, and CGL3 may have the same structure and function as those of the lower charge generating layer CGL-1 described with reference to FIG. 4. Upper charge generating layers CGL-2, CGL-4, and CGL-6 respectively included in the charge generating layers CGL1, CGL2, and CGL3 may have the same structure and function as those of the upper charge generating layer CGL-2 described with reference to FIG. 4.

Referring to FIG. 7, the organic light emitting diode OLED-2 includes the first electrode layer E1, the first light emitting unit EU-1, a first charge generating layer CGL1, a third light emitting unit EU-3, a second charge generating layer CGL2, a second light emitting unit EU-2, and a second electrode layer E2, which are sequentially stacked in the third direction D3.

According to some example embodiments, the third light emitting unit EU-3 is arranged between the first charge generating layer CGL1 and the second charge generating layer CGL2. Accordingly, a third light emitting layer of the third light emitting unit EU-3 is located between a first light emitting layer of the first light emitting unit EU-1 and a second light emitting layer of the second light emitting unit EU-2.

The first charge generating layer CGL1 is arranged between the first light emitting layer of the first light emitting unit EU-1 and the third light emitting layer of the third light emitting unit EU-3, and the second charge generating layer CGL2 is arranged between the second light emitting layer of the second light emitting unit EU-2 and the third light emitting layer of the third light emitting unit EU-3.

In addition, the second light emitting unit EU-2 includes a second hole control layer arranged between the second charge generating layer CGL2 and the second light emitting layer of the second light emitting unit EU-2, and the third light emitting unit EU-3 includes a third hole control layer arranged between the first charge generating layer CGL1 and the third light emitting layer of the third light emitting unit EU-3. According to some example embodiments, as the organic light emitting diode OLED-2 includes three light emitting layers, the organic light emitting diode OLED-2 may have a third resonance structure.

Referring to FIG. 8, the organic light emitting diode OLED-3 includes the first electrode layer E1, the first light emitting unit EU-1, a first charge generating layer CGL1, a fourth light emitting unit EU-4, a third charge generating layer CGL3, a third light emitting unit EU-3, a second charge generating layer CGL2, a second light emitting unit EU-2, and a second electrode layer E2.

According to some example embodiments of the present disclosure, the fourth light emitting unit EU-4 is arranged between the first charge generating layer CGL1 and the third charge generating layer CGL3, and the third light emitting unit EU-3 is arranged between the third charge generating layer CGL3 and the second charge generating layer CGL2. Accordingly, a fourth light emitting layer of the fourth light emitting unit EU-4 is located between a first light emitting layer of the first light emitting unit EU-1 and a third light emitting layer of the third light emitting unit EU-3, and a third light emitting layer of the third light emitting unit EU-3 is located between the fourth light emitting layer of the fourth light emitting unit EU-4 and a second light emitting layer of the second light emitting unit EU-2.

The fourth light emitting unit EU-4 includes a fourth hole control layer located between the first charge generating layer CGL1 and the third light emitting layer of the third light emitting unit EU-3, and the third light emitting unit EU-3 includes a third hole control layer located between the third charge generating layer CGL3 and the second light emitting layer of the second light emitting unit EU-2. According to some example embodiments, the organic light emitting diode OLED-3 may include four light emitting layers, and the organic light emitting diode OLED-3 may have a fourth resonance structure.

Although aspects of some example embodiments of the present disclosure have been described, it is understood that embodiments according to the present disclosure should not be limited to these example embodiments but various changes and modifications can be made by one ordinary skilled in the art within the spirit and scope of embodiments according to the present disclosure as defined in the claims and their equivalents.

Therefore, the disclosed subject matter should not be limited to any single embodiment described herein, and the scope of embodiments according to the present inventive concept shall be determined according to the attached claims and their equivalents.

What is claimed is:

1. An organic light emitting diode comprising:
   a first electrode layer;
   a second electrode layer on the first electrode layer and facing the first electrode layer;
   a first light emitting layer between the first electrode layer and the second electrode layer and comprising a phosphorescent material;
   a first hole control layer between the first electrode layer and the first light emitting layer;
   a second light emitting layer between the first light emitting layer and the second electrode layer and comprising a fluorescent material;
   a charge generating layer between the first light emitting layer and the second light emitting layer, the first hole control layer having a thickness equal to or greater than 100 angstroms and equal to or smaller than 900 angstroms,
   wherein a resonance distance of the organic light emitting diode is a distance between a surface of the first electrode layer and a surface of the second electrode layer, which faces the surface of the first electrode layer.

2. The organic light emitting diode of claim 1, wherein the first light emitting layer and the second light emitting layer are configured to generate light having a same color.

3. The organic light emitting diode of claim 2, wherein the light is a blue color light.

4. The organic light emitting diode of claim 1, wherein the first electrode layer is a reflective electrode layer, and the second electrode layer is a semi-transmissive electrode layer.

5. The organic light emitting diode of claim 1, further comprising a third light emitting layer between the first light emitting layer and the second light emitting layer, wherein the charge generating layer comprises a first charge generating layer and a second charge generating layer, the first charge generating layer is between the first light emitting layer and the third light emitting layer, and the second charge generating layer is between the second light emitting layer and the third light emitting layer.

6. The organic light emitting diode of claim 5, further comprising a fourth light emitting layer between the first light emitting layer and the third light emitting layer, wherein the charge generating layer further comprises a third charge generating layer, and the third charge generating layer is between the fourth light emitting layer and the third light emitting layer.

7. The organic light emitting diode of claim 6, further comprising at least one of a second hole control layer between the second charge generating layer and the second light emitting layer, a third hole control layer between the third charge generating layer and the third light emitting layer, or a fourth hole control layer between the first charge generating layer and the fourth light emitting layer.

8. The organic light emitting diode of claim 7, wherein each of the first, second, third, and fourth hole control layers comprises at least one of a hole injection layer, a hole transport layer, a hole buffer layer, or an electron blocking layer.

9. The organic light emitting diode of claim 7, further comprising electron control layers respectively on the first, second, third, and fourth light emitting layers, wherein the electron control layers comprise at least one of an electron injection layer, an electron transport layer, or a hole blocking layer.

10. A display device comprising:
a display panel; and
a color control layer on the display panel, the display panel comprising:
a first electrode layer;
a second electrode layer on the first electrode layer to face the first electrode layer;
a first light emitting layer between the first electrode layer and the second electrode layer, and configured to generate a first light having a first predetermined wavelength, and comprising a phosphorescent material;
a first hole control layer between the first electrode layer and the first light emitting layer;
a second light emitting layer between the first light emitting layer and the second electrode layer, and configured to generate a second light having a second predetermined wavelength, and comprising a fluorescent material;
a charge generating layer between the first light emitting layer and the second light emitting layer, wherein the first light has a same color as the second light,
wherein a distance between a surface of the first electrode layer and a surface of the second electrode layer which faces the surface of the first electrode layer is defined as a resonance distance.

11. The display device of claim 10, wherein the first light and the second light are blue lights.

12. The display device of claim 10, wherein the first hole control layer has a thickness equal to or greater than 100 angstroms and equal to or smaller than 900 angstroms.

13. The display device of claim 10, wherein the first electrode layer is a reflective electrode layer, and the second electrode layer is a semi-transmissive electrode layer.

14. The display device of claim 10, wherein the display panel further comprises a third light emitting layer between the first light emitting layer and the second light emitting layer, the charge generating layer is provided in a plural number and comprises a first charge generating layer and a second charge generating layer, the first charge generating layer is between the first light emitting layer and the third light emitting layer, and the second charge generating layer is between the second light emitting layer and the third light emitting layer.

15. The display device of claim 14, wherein the display panel further comprises a fourth light emitting layer between the first light emitting layer and the third light emitting layer, the charge generating layer further comprises a third charge generating layer, and the third charge generating layer is between the fourth light emitting layer and the third light emitting layer.

16. The display device of claim 15, further comprising at least one of a second hole control layer between the second charge generating layer and the second light emitting layer, a third hole control layer between the third charge generating layer and the third light emitting layer, or a fourth hole control layer between the first charge generating layer and the fourth light emitting layer.

17. The display device of claim 16, wherein each of the first, second, third, and fourth hole control layers comprises at least one of a hole injection layer, a hole transport layer, a hole buffer layer, or an electron blocking layer.

18. The display device of claim 16, further comprising electron control layers respectively on the first, second, third, and fourth light emitting layers, wherein each of the electron control layers comprises at least one of an electron injection layer, an electron transport layer, or a hole blocking layer.

19. The display device of claim 10, wherein the color control layer comprises a quantum dot.

* * * * *